United States Patent [19]
Huang et al.

[11] Patent Number: 6,140,192
[45] Date of Patent: Oct. 31, 2000

[54] METHOD FOR FABRICATING SEMICONDUCTOR DEVICE

[75] Inventors: Michael W C Huang, Taipei Hsien; Hsiao-Ling Lu, Chung Ho; Tri-Rung Yew, Hsinchu Hsien, all of Taiwan

[73] Assignee: United Microelectronics Corp., Hsinchu, Taiwan

[21] Appl. No.: 09/346,554

[22] Filed: Jun. 30, 1999

[51] Int. Cl.$^7$ .................................................. H01L 21/336
[52] U.S. Cl. ............................................ 438/305; 438/595
[58] Field of Search .......................... 438/305, FOR 188, 438/FOR 199, 595

[56] References Cited

U.S. PATENT DOCUMENTS

5,573,965  11/1996  Chen et al. .
5,783,479   7/1998  Lin et al. .
5,851,890  12/1998  Tsai et al. .
5,915,182   6/1999  Wu .

*Primary Examiner*—George Fourson
*Assistant Examiner*—Joannie A. Garcia
*Attorney, Agent, or Firm*—Hickman Coleman & Hughes, LLP

[57] ABSTRACT

A method for fabricating a semiconductor device. A substrate having a gate is provided. An ion implantation process is performed to form lightly doped source/drain region in the substrate. A liner layer and an insulation layer are formed over a substrate in sequence. A portion of the insulation layer is removed by an anisotropic etching process. The insulation layer remaining on sidewalls of the gate is used as a spacer. A top of the spacer is substantially level with an upper surface of the liner layer. An ion implantation process is performed to form heavily doped source/drain region in the substrate. A portion of the spacer is removed by wet etching. As a result, a top surface of the spacer is lower than the upper surface of the gate. The method can increase the exposed surface of the gate and maintain sufficient width of the lightly doped source/drain region to prevent the hot carrier effect and the short channel effect.

16 Claims, 6 Drawing Sheets

METHOD FOR FABRICATING SEMICONDUCTOR DEVICE

BACKGROUND OF THE INVENTION

1. Field of the Invention

The present invention relates to a method for fabricating an integrated circuit. More particularly, the present invention relates to a method for fabricating a semiconductor device.

2. Description of the Related Art

Metal silicide has many advantages—high melting point, stability and low resistance. Thus, the salicide process is currently applied in the manufacturing process for very large scale integration (VLSI) and ultra large scale integration (ULSI) devices.

When integration of elements in integrated circuits (IC) increases, line widths and geometries for semiconductor devices are reduced. However, source/drain region resistance in metal oxide semiconductor (MOS) transistors simultaneously increases, and the polysilicon electrodes that form the MOS gates and wiring lines within semiconductor devices introduce undesirable resistance. In order to reduce resistance and RC delay time to improve the operating speed of a device, a self-aligned silicide (salicide) process is employed. Therefore, a response time or an operating speed of the whole device is increased by reducing the gate resistance and the junction resistance.

Figure 1A:
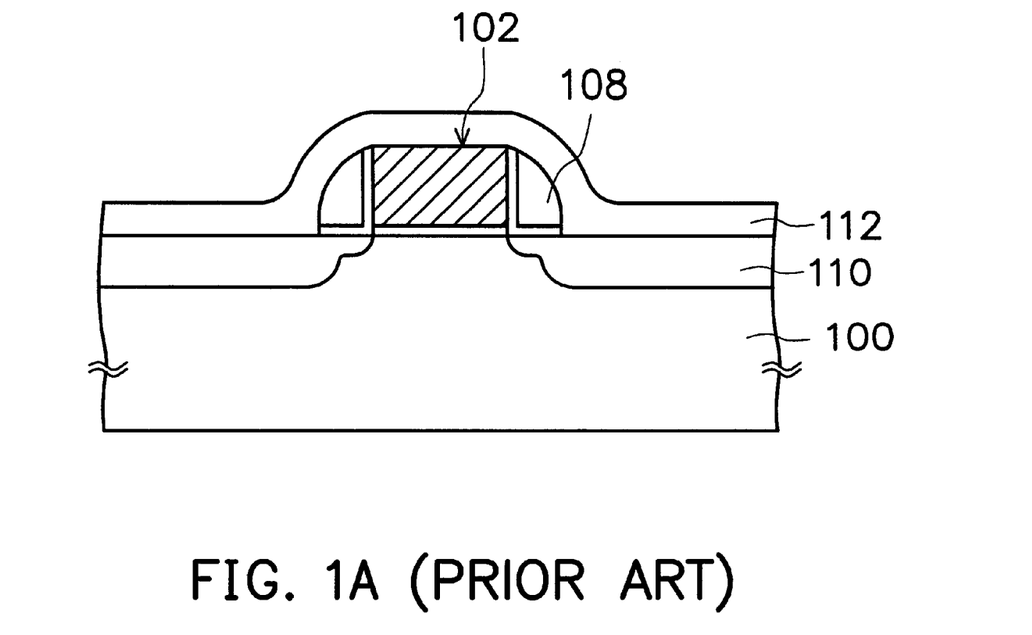
FIGS. 1A through 1B are schematic, cross-sectional views showing the progression of the conventional manufacturing steps for a self-aligned silicide.
Figure 1B:
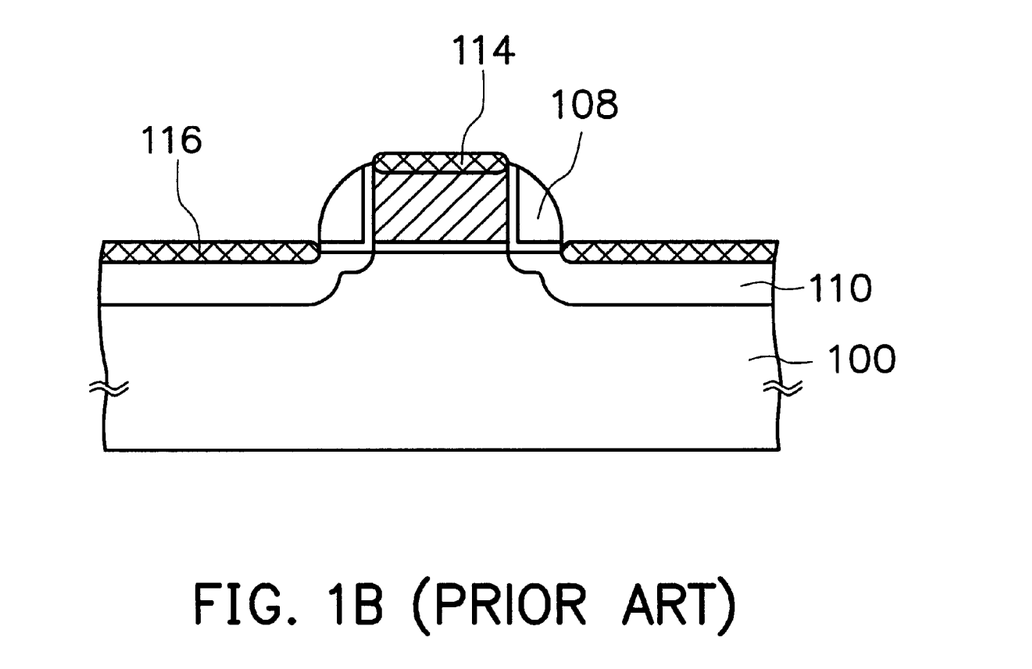

A typical implementation of a silicide on a polysilicon electrode or silicon substrate is known as a self-aligned silicide process. It is employed to reduce semiconductor device resistance. FIGS. 1A through 1B are schematic, cross-sectional views showing the progression of the conventional manufacturing steps for a self-aligned silicide.

Referring to FIG. 1A, a substrate 100 having a patterned gate 102 is provided, and a lightly doped source/drain region is formed in the substrate 100 by an ion implantation process. A liner layer and an insulation layer are formed over the substrate 100 in order. Next, a portion of the insulation layer is removed by an etching process to form a spacer 108 on sidewalls of the patterned gate 102. The spacer 108 is used as a mask, and then a heavily doped source/drain region is formed in the substrate 100 by an ion implantation process, wherein the heavily doped source/drain region and the lightly doped source/drain region together form a source/drain region 110. A metallic layer 112 for forming a silicide is deposited over the substrate 100, and then an annealing process is performed. The metallic layer 112 only reacts with the silicon of the gate 102 and the source/drain region 110 to form a silicide layer 114 and 116 after performing the annealing process. The unreacted metallic layer 112 is removed by selective wet etching, as shown in FIG. 1B. Since the whole process of forming the silicide layer 114 and 116 does not require a photolithography step, the process is called a self-aligned silicide.

As integration of elements in integrated circuits (IC) increases, line widths and geometries for semiconductor devices are reduced. Therefore, an undesired resistance occurs in the polysilicon gate. To reduce the undesired resistance of the polysilicon gate, the top surface of the spacer 108 is lower than the upper surface of the gate 102. A portion of the gate 102 sidewalls is exposed, so that the exposed surface of the gate 102 is increased. As a result, contact area of the gate 102 and the metallic layer 112 is increased to enhance a volume of the silicide layer 114, and the resistance of the gate 102 is thereby reduced.

Another typical manufacturing method for semiconductors is provided to improve the drawback mentioned above.

Figure 2A:
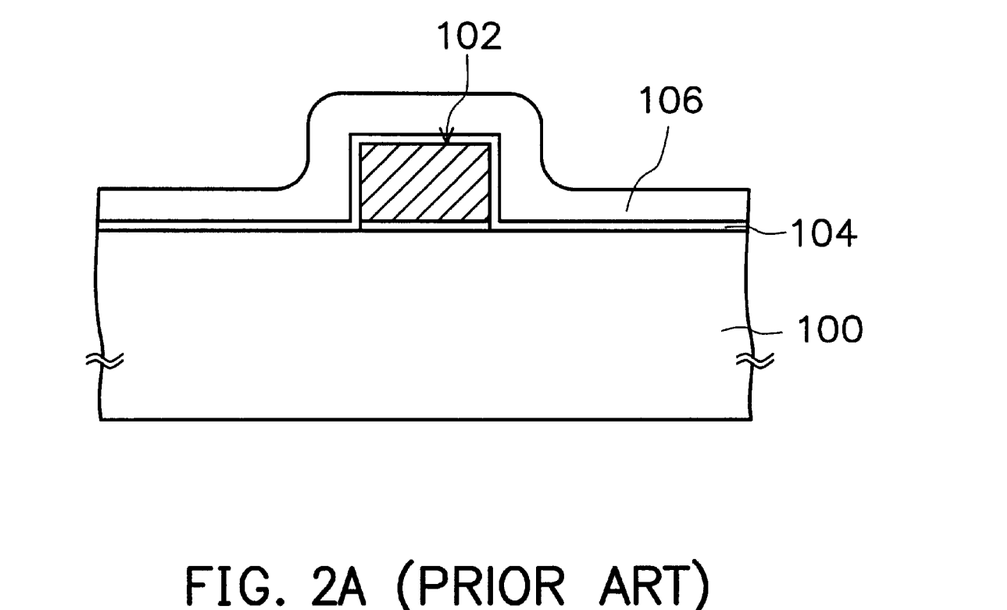
FIG. 2A through FIG. 2B are schematic, cross-sectional views showing the progression of the conventional manufacturing steps for a semiconductor device spacer.
Figure 2B:
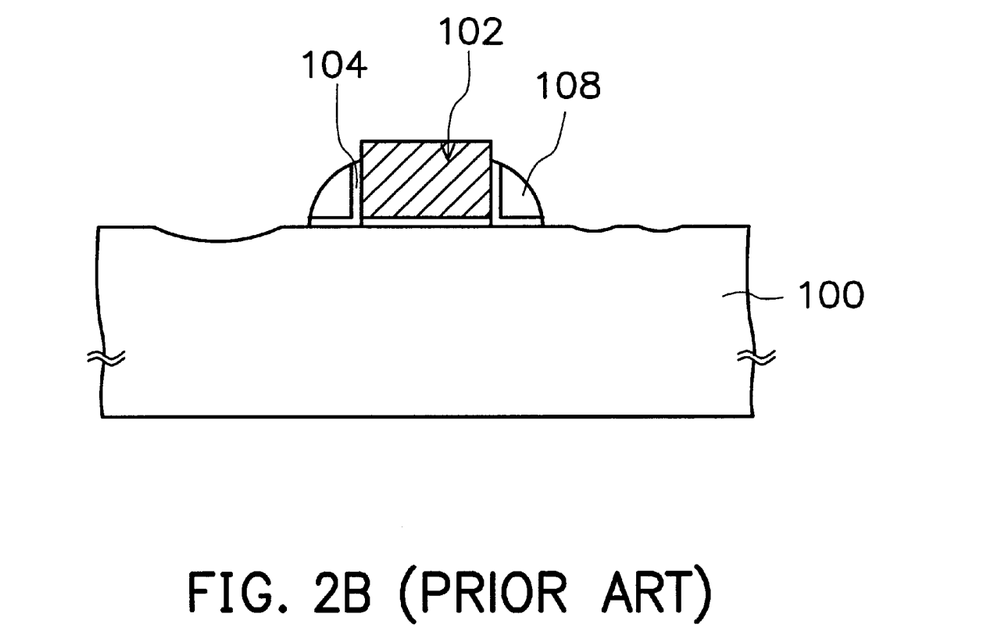

FIGS. 2A through FIG. 2B are schematic, cross-sectional views showing the progression of the conventional manufacturing steps for a semiconductor spacer.

Referring to FIG. 2A, a substrate 100 having a gate 102 is provided, and a liner layer 104 is formed on the substrate 100. Then, an insulation layer 106 is conformally formed over the substrate 100. The insulation layer 106 is made of a material such as silicon nitride layer. Subsequently, a portion of the insulation layer 106 is removed by an anisotropic dry etching process, and then the insulation layer 106 remaining on sidewalls of the gate 102 is used as a spacer 108, as shown in FIG. 2B. For exposing a portion of sidewalls of the gate 102, an over-etching process is performed after the anisotropic dry etching process. As a result, the spacer 108 and the liner layer 104 are transformed into a spacer 108a and a liner layer 104a, respectively. A portion of the sidewalls of the gate 102 is exposed, so that the top surface of the spacer 108 is lower than that of the gate 102 upper surface as shown in FIG. 2C.

However, the thickness of the liner layer 104 formed on the substrate 100 is not uniform, and a portion of the substrate 100, which is covered by the thinner part of the liner layer 104, is exposed during the over-etching process. Damage easily occurs on the substrate 100 as shown in FIG. 2B. Moreover, reactive particles, such as argon, bombarding the spacer 108 rebound therefrom to a specific position on substrate 100, so that damage occurs during the dry etching process. The conventional method described above for forming the spacer 108 easily damages the substrate 100. As a result, the reliability of the whole device is decreased.

SUMMARY OF THE INVENTION

Accordingly, the present invention provides a method for fabricating a semiconductor device. The method can increase the exposed surface area of a gate.

The present invention provides a method for fabricating a semiconductor device. The method can protect the substrate from damage during an etching process for forming a spacer and avoids reducing the reliability of the whole device.

The present invention provides a method for fabricating a semiconductor device. The method can maintain sufficient width of the lightly doped source/drain region to prevent the hot carrier effect and the short channel effect.

To achieve these and other advantages and in accordance with the purpose of the invention, as embodied and broadly described herein, the invention provides a method for fabricating a semiconductor device. A substrate having a gate is provided, and an ion implantation process is performed to form lightly doped source/drain region in the substrate. A liner layer and an insulation layer are formed over the substrate in order. Next, a portion of the insulation layer is removed by an anisotropic etching process. The insulation layer remaining on sidewalls of the gate is used as a spacer. The top surface of the spacer is substantially level with the liner layer. Then, a portion of the spacer is removed by wet etching. As a result, the top surface of the spacer is lower than that of the gate. Then, an ion implantation process is performed to form a heavily doped source/drain region in the substrate, wherein the heavily doped source/drain region and the lightly doped source/drain region form a source/drain region. The method can protect the substrate from damage during an etching process for forming a spacer and avoids reducing the reliability of the whole device and increase the exposed surface of the gate.

To achieve these and other advantages and in accordance with the purpose of the invention, as embodied and broadly described herein, the invention provides a method for fabricating a semiconductor device. A substrate having a gate is provided. An ion implantation process is performed to form lightly doped source/drain region in the substrate. A liner layer and an insulation layer are formed over a substrate in order. A portion of the insulation layer is removed by an anisotropic etching process. The insulation layer remaining on sidewalls of the gate is used as a spacer. A top of the spacer is substantially level with an upper surface of the liner layer. An ion implantation process is performed to form heavily doped source/drain region in the substrate. A portion of the spacer is removed by wet etching. As a result, a top surface of the spacer is lower than the upper surface of the gate. The method can increase the exposed surface of the gate and maintain sufficient width of the lightly doped source/drain region to prevent the hot carrier effect and the short channel effect.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIGS. 3A through 3F are schematic, cross-sectional views showing the progression of the manufacturing steps for a semiconductor device in accordance with the preferred embodiment of the first present invention.

Figure 3A:
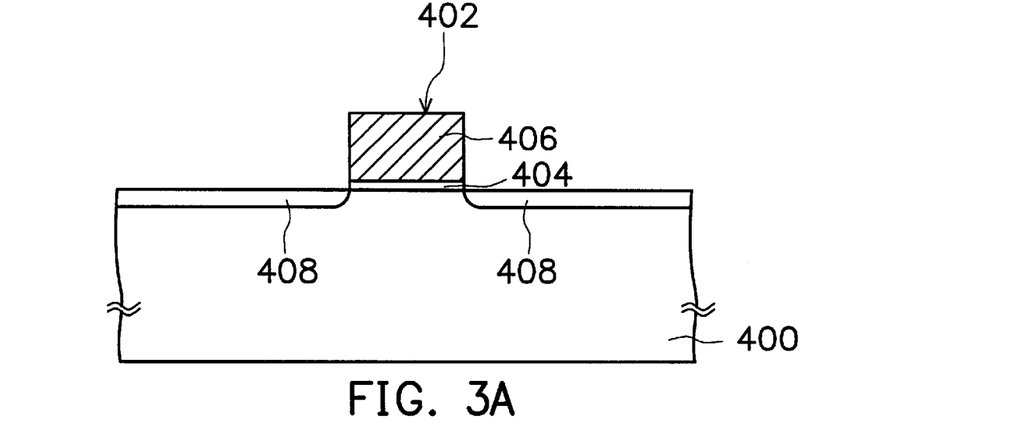
FIGS. 3A through 3F are schematic, cross-sectional views showing the progression of the manufacturing steps for a semiconductor device in accordance with the first preferred embodiment of the present invention.

Referring to FIG. 3A, a substrate 400 having a gate 402 is provided. The substrate 400 is a p-type silicon or an n-type silicon substrate, for example. The gate 402 includes a gate oxide layer 404 and conductive layer 406. The conductive layer 406 made of a material such as polysilicon is formed, for example, by chemical vapor deposition (CVD). The gate 402 is used as a mask, and an ion implantation process is performed to form a lightly doped source/drain region 408 in the substrate 400. The impurity implanted into the substrate 400 is chosen according to the type of the substrate 400.

Figure 3B:
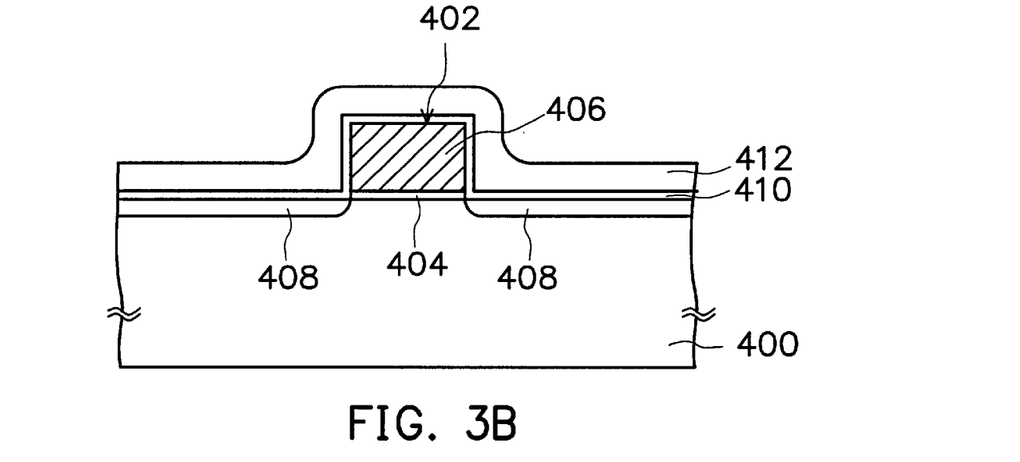

Referring to FIG. 3B, a liner layer 410 and an insulation layer 412 are formed over the substrate 400 in sequence, and the liner layer 410 is formed along a surface profile of the substrate 400. The liner layer 410 is used to protect the substrate 400 during the subsequent etching process and to reduce stress between the insulation layer 412 and the gate 402. The liner layer 410 is made of a material such as silicon oxide, and the liner layer 410 is formed, for example, by chemical vapor deposition using tetraethosiloxane (TEOS) as a gas source. The insulation layer 412 is made of a material such as silicon nitride, and the insulation layer 412 is formed, for example, by chemical vapor deposition. The etching rate of the liner layer 410 is different from that of the insulation layer 412, so that the liner layer 410 remains after a subsequent etching process.

Figure 3C:
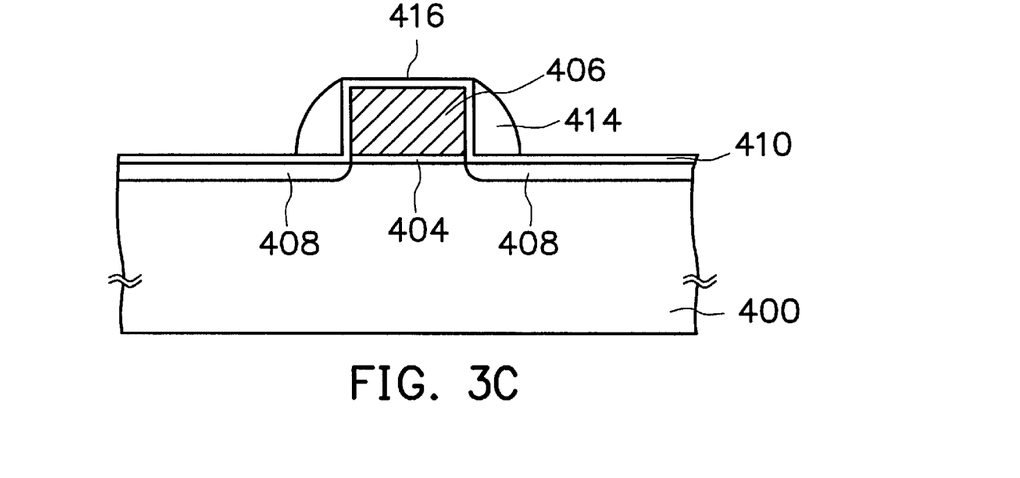

Referring to FIG. 3C, the liner layer 410 is used as an etching stop layer for performing an anisotropic etching process, such as dry etching, to remove a portion of the insulation layer 412. The insulation layer 412 remaining on sidewalls of the gate 402 is used as a spacer 414. After the anisotropic etching process, the top surface of the spacer 414 is substantially level with a top surface 416 of the liner layer 410.

In order to expose a portion of the gate 402 sidewalls, the anisotropic etching process preferably includes two etching steps. The first etching step is dry etching, and the second etching step is wet etching.

Figure 3D:
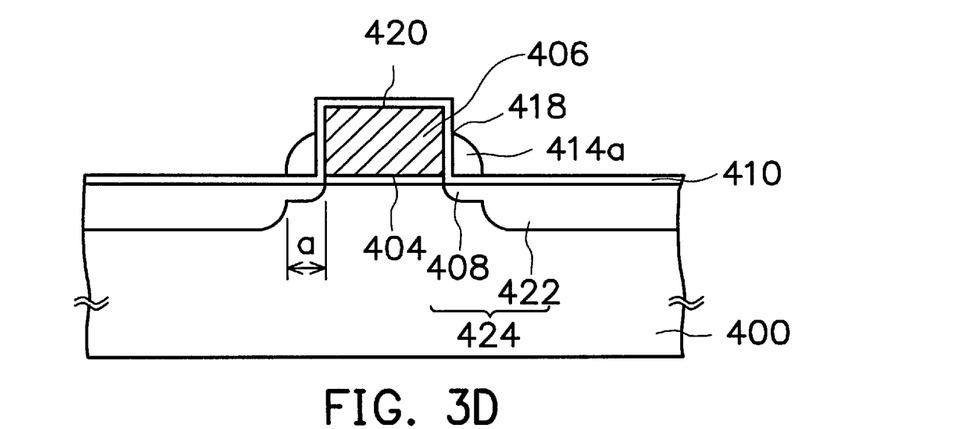

Referring to FIG. 3D, the liner layer 410 is used as an etching stop layer, a wet etching process is performed to remove a portion of the spacer 414, and then a spacer 414a is formed. The top surface 418 of the spacer 414a is lower than the top surface 420 of the gate 402. A width of a bottom portion of the spacer 414a is about 600–700 Å. That is, a width "a" of the lightly doped source/drain region 408 underlying the spacer 414a is about 600–700 Å. The wet etching process is performed to form the spacer 414a by using an etchant such as hot phosphoric acid, wherein the etchant has good etching selectivity between the spacer 414 and the liner layer 410. The liner layer 410 remains during the wet etching process. Therefore, the remaining liner layer 410 can protect the substrate 400 from being damaged during etching step for forming the spacer 414a. Therefore, the reliability of the whole device is maintained.

In the invention, a wet etching is performed to form a spacer by using hot phosphoric acid as an etchant, and the material of the spacer includes silicon nitride. Because hot phosphoric acid has good etching selectivity between the silicon nitride layer and the liner layer, the liner layer remains during the wet etching process. Therefore, the remaining liner layer can protect the substrate surface from damage during etching step. Therefore, the reliability of the whole device is maintained.

An ion implantation process is performed with the gate 402 and spacer 414a serving as a mask. A heavily doped source/drain region 422 is formed in the substrate 400, wherein the heavily doped source/drain region 422 and the lightly doped source/drain region 408 form a source/drain region 424. The ions implanted into the substrate 400 are selected according to the type of the substrate 400.

Figure 3E:
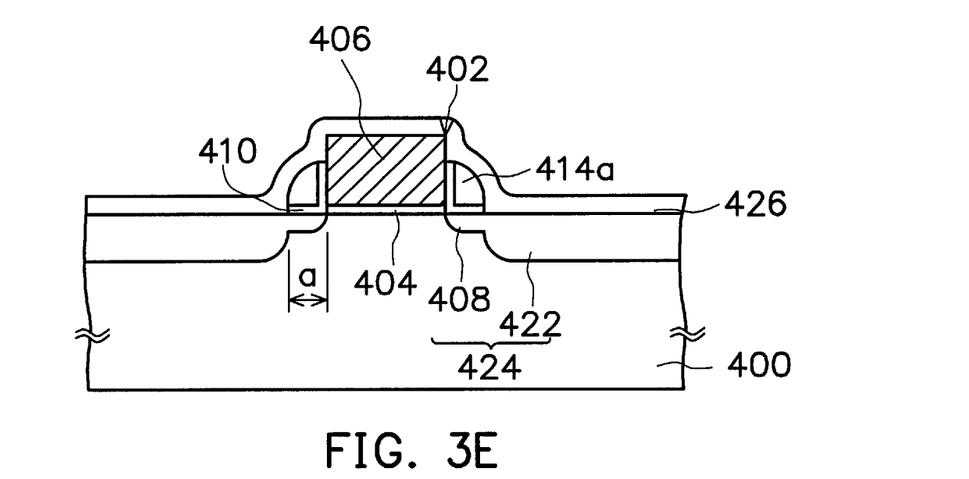

Referring to FIG. 3E, a portion of the liner layer 410 is removed, for example, by wet etching to expose the top surface of the conductive layer 406 of the gate 402 and the surface of the substrate 400 uncovered by the gate 402 and the spacer 414a. A metallic layer 426 is deposited over the substrate 400; preferably, the metallic layer 426 is conformal to the surface profile of the substrate 400. The metallic layer 426 is formed by, for example, chemical vapor deposition or physical vapor deposition.

Figure 3F:
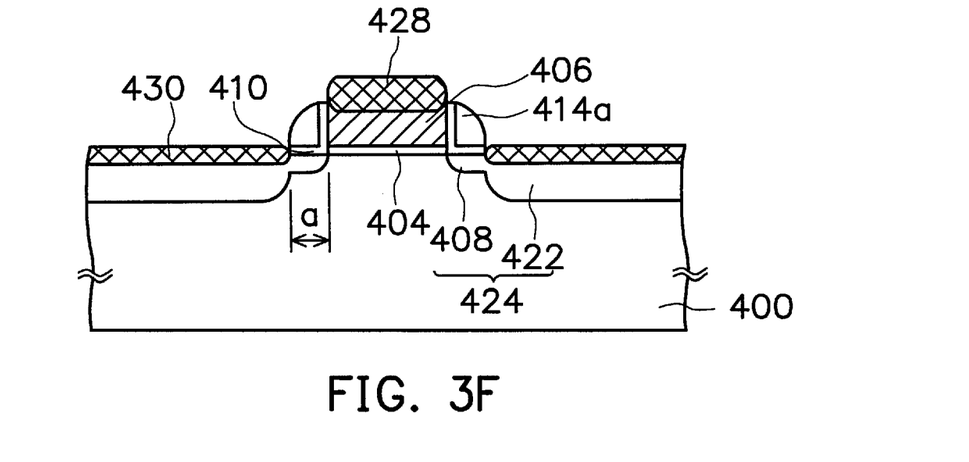

Referring to FIG. 3F, the metallic layer 426 reacts with the conductive layer 406 and the source/drain region 424 to form silicide layers 428 and 430 by performing an annealing process. Preferably, the unreacted metallic layer 426 is removed by selective wet etching.

Because the top 418 of the spacer 414a is lower than the top surface 420 of the gate 402, the exposed surface of the conductive layer 406 is increased. Therefore, the volume and contact area of the silicide layer 428 are increased. The resistance of the gate 402 is reduced.

The method can increase the exposed surface of the gate 402. However, the width of the remaining bottom portion of the spacer 414a is only about 600–700 Å; thus, the width "a" of the lightly doped source/drain region 408 underlying the spacer 414a is about 600–700 Å. As a result, in a logic circuit, the width "a" of the lightly doped source/drain region 408 is not enough to prevent hot carrier effect and short channel effect. (second embodiment)

FIGS. 4A through 4F are schematic, cross-sectional views showing the progression of the manufacturing steps for a semiconductor device in accordance with the preferred embodiment of the second present invention.

Figure 4A:
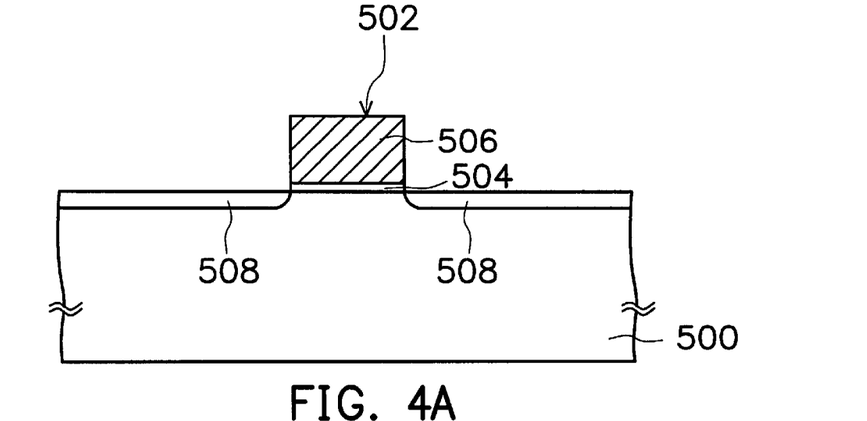
FIGS. 4A through 4F are schematic, cross-sectional views showing the progression of the manufacturing steps for a semiconductor device in accordance with the preferred embodiment of the second present invention.

Referring to FIG. 4A, a substrate 500 having a gate 502 is provided. The substrate 500 is a p-type silicon or an n-type silicon substrate, for example. The gate 502 includes a gate oxide layer 504 and conductive layer 506. The conductive layer 506 made of a material such as polysilicon is formed, for example, by chemical vapor deposition (CVD). The gate 502 is used as a mask, and an ion implantation process is performed to form a lightly doped source/drain region 508 in the substrate 500. The impurity implanted into the substrate 500 is selected according to the type of the substrate 500.

Figure 4B:
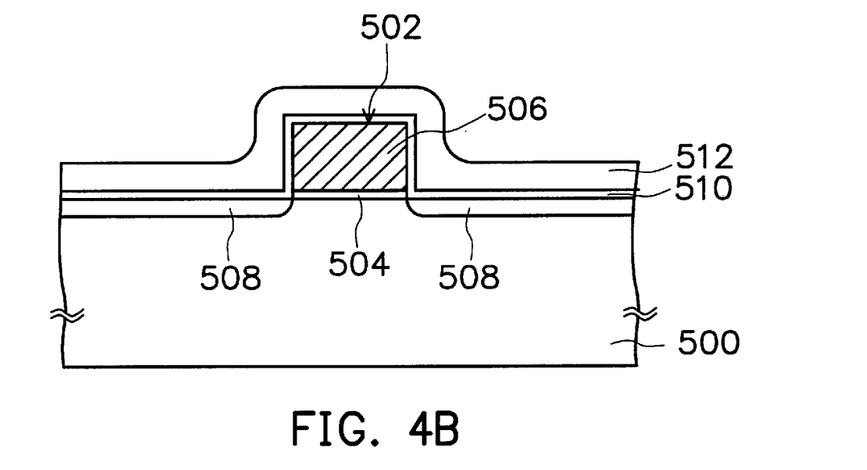

Referring to FIG. 4B, a liner layer 510 and an insulation layer 512 are formed over the substrate 500 in sequence, and the liner layer 510 is formed along a surface profile of the substrate 500. The liner layer 510 is used to protect the substrate 500 during the subsequent etching process and to reduce stress between the insulation layer 512 and the gate 502. The liner layer 510 is made of a material such as silicon oxide, and the liner layer 510 is formed, for example, by chemical vapor deposition using tetraethosiloxane (TEOS) as gas source. The insulation layer 512 is made of a material such as silicon nitride, and the insulation layer 512 is formed, for example, by chemical vapor deposition. The etching rate of the liner layer 510 is different from that of the insulation layer 512, so that the liner layer 510 remains after a subsequent etching process.

Figure 4C:
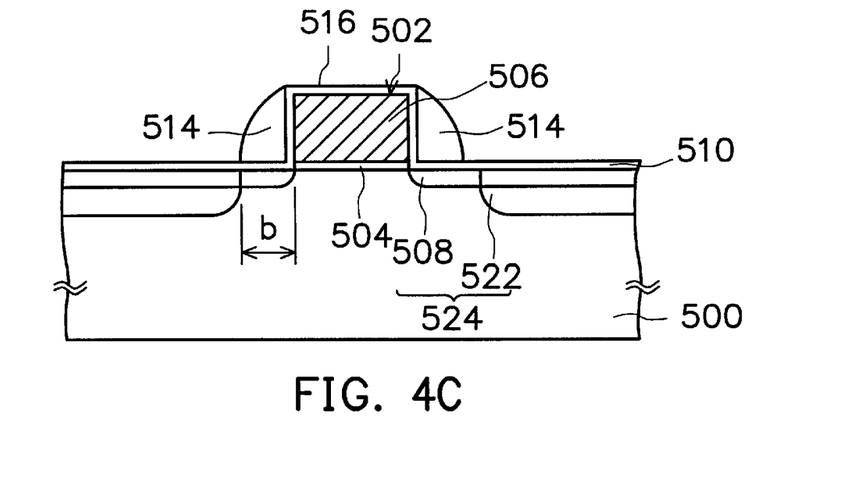

Referring to FIG. 4C, the liner layer 510 is used as an etching stop layer for performing an anisotropic etching process, such as dry etching, to remove a portion of the insulation layer 512. The insulation layer 512 remaining on sidewalls of the gate 502 is used as a spacer 514. After the anisotropic etching process, the top surface of the spacer 514 is substantially level with a top surface 516 of the liner layer 510. A width of a bottom portion of the spacer 514 is about 800–900 Å. That is, a width "b" of the lightly doped source/drain region 508 underlying the spacer 514 is about 800–900 Å.

An ion implantation process is performed in which the gate 502 and the spacer 514 serve as a mask. A heavily doped source/drain region 522 is formed in the substrate 500, wherein the heavily doped source/drain region 522 and the lightly doped source/drain region 508 form a source/drain region 524. The ions implanted into the substrate 500 are selected according to the type of the substrate 500.

In order to expose a portion of the gate 502 sidewalls, the anisotropic etching process preferably includes two etching steps to etch the spacer 514, in sequence. The first etching step is dry etching, and the second etching step is wet etching.

Figure 4D:
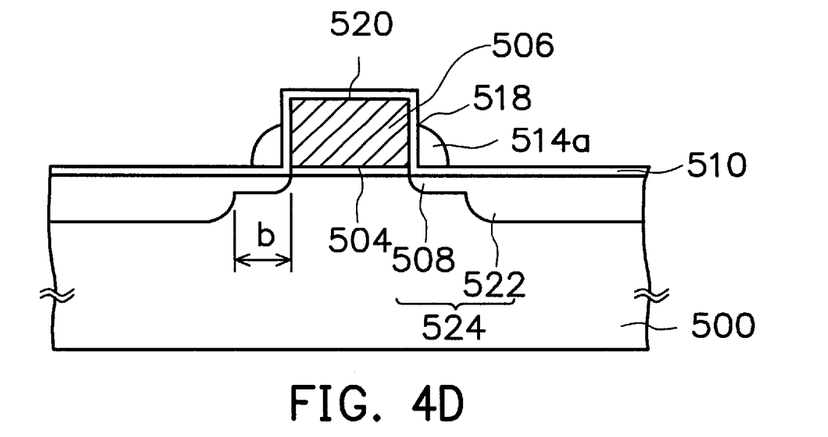

Referring to FIG. 4D, the liner layer 510 is used as an etching stop layer, a wet etching process is performed to remove a portion of the spacer 514, and then a spacer 514a is formed. The top surface 518 of the spacer 514a is lower than the top surface 520 of the gate 502. A distance from the top 518 of the spacer 514a to a top surface 520 of the gate 502 is about 300–500 Å. The wet etching process is performed to form the spacer 514a with an etchant such as hot phosphoric acid, wherein the etchant has a good etching selectivity between the spacer 514 and the liner layer 510. The liner layer 510 remains during the wet etching process. Therefore, the remaining liner layer 510 can protect the substrate 500 from damage during etching step. Therefore, the reliability of the whole device is maintained.

In the invention, a wet etching using hot phosphoric acid as an etchant is performed to form a spacer, and the material of the spacer includes silicon nitride. Because hot phosphoric acid has good etching selectivity between the silicon nitride layer and the liner layer, the liner layer remains during the wet etching process. Therefore, the remaining liner layer can protect the substrate surface from damage during the etching step. Therefore the reliability of the whole device is maintained.

Figure 4E:
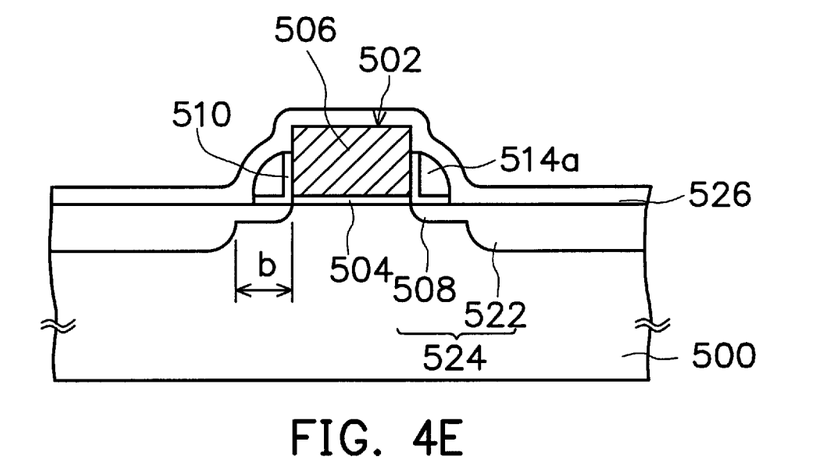

Referring to FIG. 4E, a portion of the liner layer 510 is removed, for example, by wet etching to expose the top surface of the conductive layer 506 of the gate 502 and the surface of the substrate 500 uncovered by the gate 502 and the spacer 514a. A metallic layer 526 is deposited over the substrate 500; preferably, the metallic layer 526 is conformal to the surface profile of the substrate 500. The metallic layer 526 is formed by, for example, chemical vapor deposition or physical vapor deposition.

Figure 4F:
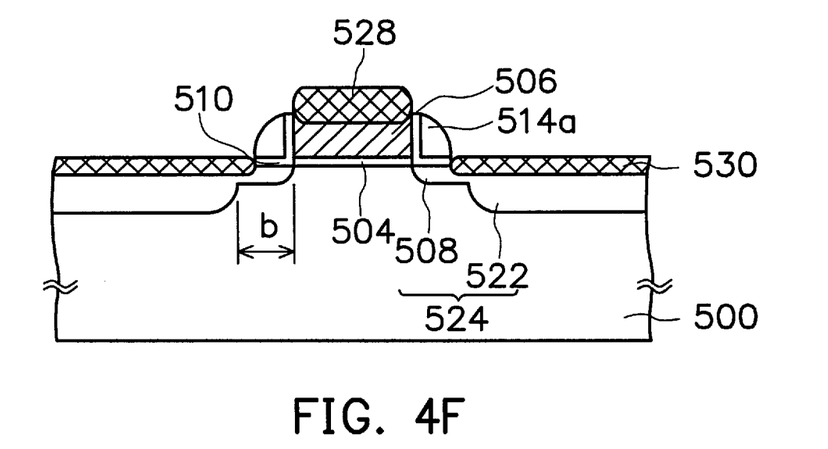

Referring to FIG. 4F, an annealing process is performed to make the metallic layer 526 react with the conductive layer 506 and the source/drain region 524 to form a silicide layer 528 and 530. Preferably, the unreacted metallic layer 526 is removed by selective wet etching.

Because the top 518 of the spacer 514a is lower than the top surface 520 of the gate 502, the exposed surface of the conductive layer 506 is increased. Therefore, the volume and contact area of the silicide layer 528 are increased. The resistance of the gate 502 is reduced.

Furthermore, a key feature of the invention is that an ion implantation step is performed to form the heavily doped source/drain region 522 after forming the spacer 514 by dry etching. As a result, the width of the lightly doped source/drain region 508 is fully based on the width of the bottom portion of the spacer 514. Next, a portion of the spacer 514 is removed by wet etching step so as to form the top 518 of the spacer 514a with a height lower than the top surface 520 of the gate 502. Therefore, the method can increase the exposed surface of the conductive layer 506 and maintain sufficient width of the lightly doped source/drain region 508 (about 800–900 Å) to prevent the hot carrier effect and the short channel effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a semiconductor device, the method comprising the steps of:

forming a gate on a substrate;

forming a lightly doped source/drain region in the substrate;

forming a liner layer conformal to the substrate;

forming a spacer on the liner layer over sidewalls of the gate, wherein a top of the spacer is substantially level with a top surface of the liner layer over a top surface of the gate;

forming a heavily doped source/drain region in the substrate, wherein the heavily doped source/drain region and the lightly doped source/drain region constitute a source/drain region; and performing a wet etching process to remove a portion of the spacer, so that the top of the spacer is lower than the top surface of the gate.

2. The method of claim 1, wherein the spacer includes a silicon nitride layer.

3. The method of claim 1, wherein the spacer is formed by performing an anisotropic etching process on an insulation layer formed on the liner layer.

4. The method of claim 1, wherein the anisotropic etching process includes a dry etching step.

5. The method of claim 1, wherein the wet etching includes using phosphoric acid as an etchant.

6. A method for fabricating a semiconductor device, the method comprises the steps of:

forming a polysilicon layer on a substrate;

forming a first doped region in the substrate;

forming a liner layer conformal to the substrate;

forming an insulation layer on the liner layer;

etching the insulation layer by an anisotropic etching process to form a spacer on the liner layer covering a sidewall of the polysilicon layer, wherein a top of the spacer is substantially level with a top surface of the liner layer;

forming a second region in the substrate;

performing a wet etching process to remove a portion of the spacer after forming the second region in the substrate, so that the top of the spacer is lower than the top surface of the gate;

etching the liner layer to expose the top surface and a part of the sidewall of the polysilicon layer; and forming a self-aligned silicide layer on the top surface of the polysilicon layer.

7. The method of claim 6, wherein the spacer includes a silicon nitride layer.

8. The method of claim 7, wherein the wet etching includes using phosphoric acid as an etchant.

9. The method of claim 6, wherein the wet etching includes using phosphoric acid as an etchant.

10. A method for fabricating a semiconductor device, the method comprising the steps of:

forming a polysilicon layer on a substrate;

forming a first doped region in the substrate;

forming a liner layer conformal to the substrate;

forming an insulation layer on the liner layer;

etching the insulation layer by an anisotropic etching process to form a spacer on the liner layer covering a sidewall of the polysilicon layer, wherein a top of the spacer is substantially level with a top surface of the liner layer;

performing a wet etching process to remove a portion of the spacer, so that the top of the spacer is lower than the top surface of the gate;

forming a second region in the substrate after the wet etching process;

etching the liner layer to expose the top surface and a part of the sidewall of the polysilicon layer; and forming a self-aligned silicide layer on the top surface of the polysilicon layer.

11. The method of claim 10, wherein the spacer includes a silicon nitride layer.

12. The method of claim 11, wherein the wet etching includes using phosphoric acid as an etchant.

13. The method of claim 10, wherein the wet etching includes using phosphoric acid as an etchant.

14. A method for fabricating a semiconductor device, the method comprising the steps of:

forming a gate on a substrate;

forming a first doped region in the substrate;

forming a liner layer conformal to a surface profile of the substrate;

forming an insulation layer on the liner layer;

etching the insulation layer to form a spacer on the liner layer covering a sidewall of the gate, wherein a top of the spacer is substantially level with a top surface of the liner layer;

forming a second doped region in the substrate, wherein the heavily doped source/drain region and the lightly doped source/drain region constitute a source/drain region; and performing a wet etching process to remove a portion of the spacer, so that the top of the spacer is lower than the top surface of the gate.

15. The method of claim 14, wherein the spacer includes a silicon nitride layer.

16. The method of claim 14, wherein the wet etching includes using phosphoric acid as an etchant.

* * * * *